United States Patent
Bu et al.

(10) Patent No.: US 8,114,738 B2
(45) Date of Patent: *Feb. 14, 2012

(54) SYSTEM AND METHOD FOR PROVIDING LOW COST HIGH ENDURANCE LOW VOLTAGE ELECTRICALLY ERASABLE PROGRAMMABLE READ ONLY MEMORY

(75) Inventors: Jiankang Bu, Windham, ME (US); David Courtney Parker, Topsham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/803,073

(22) Filed: Jun. 18, 2010

(65) Prior Publication Data
US 2010/0259996 A1    Oct. 14, 2010

Related U.S. Application Data

(62) Division of application No. 11/515,215, filed on Sep. 1, 2006, now Pat. No. 7,777,271.

(51) Int. Cl.
H01L 21/336 (2006.01)
(52) U.S. Cl. .................. 438/257; 257/E21.68; 257/319
(58) Field of Classification Search ............... 365/185.1, 365/185.14, 185.26, 185.27, 185.28, 185.29; 257/315, 318, 319, 326, 320, 321, E29.129, 257/E21.68; 438/210, 218, 257
See application file for complete search history.

(56) References Cited

U.S. PATENT DOCUMENTS

| | | |
|---|---|---|
| 5,301,150 A | 4/1994 | Sullivan et al. |
| 5,742,452 A | 4/1998 | Simmons et al. |
| 5,969,991 A | 10/1999 | Van Houdt et al. |
| 6,191,980 B1 | 2/2001 | Kelley et al. |
| 6,324,095 B1 | 11/2001 | McPartland et al. |
| 6,326,663 B1 | 12/2001 | Li et al. |
| 6,512,700 B1 | 1/2003 | McPartland et al. |
| 6,660,579 B1 | 12/2003 | Jiang et al. |
| 2002/0047155 A1 | 4/2002 | Babcock et al. |
| 2005/0030826 A1 | 2/2005 | Diorio et al. |
| 2005/0030827 A1 | 2/2005 | Gilliland et al. |
| 2007/0097743 A1 | 5/2007 | Fang et al. |
| 2007/0120172 A1 | 5/2007 | Hsu et al. |

OTHER PUBLICATIONS

David Sowards, "Non-Volatile Memory: The principles, the technologies, and their significance to the smart card integrated circuit", 1999 Emosyn and Silicon Storage Technology, pp. 1-13.
Dr. Jan Van Houdt, et al., "HIMOS Flash technology: the best choice for embedded nonvolatile memory applications", Feb. 2001, 45 pages.

Primary Examiner — Douglas King

(57) ABSTRACT

A system and method are disclosed for increasing the reliability of a channel erase procedure in an electrically erasable programmable read only memory (EEPROM) memory cell. A memory cell of the present invention comprises a program gate, a control gate, and a floating gate that erase data using a channel erase procedure. An erase capacitor is coupled to the floating gate to provide a low voltage bias that decreases the voltage that is required to perform a Fowler-Nordheim erase process in the memory cell. The erase capacitor of the present invention is formed without adding a step in the manufacturing process of the memory cell. Memory cells of the present invention are low cost, high endurance, low voltage memory cells.

20 Claims, 5 Drawing Sheets

SYSTEM AND METHOD FOR PROVIDING LOW COST HIGH ENDURANCE LOW VOLTAGE ELECTRICALLY ERASABLE PROGRAMMABLE READ ONLY MEMORY

This application is a divisional of prior U.S. patent application Ser. No. 11/515,215 filed on Sep. 1, 2006 now U.S. Pat. No. 7,777,271 .

TECHNICAL FIELD OF THE INVENTION

The present invention is generally directed to the manufacture of integrated circuits and, in particular, to a system and method for providing low cost high endurance low voltage electrically erasable programmable read only memory (EEPROM).

BACKGROUND OF THE INVENTION

A fundamental design challenge in creating a memory cell of an electrically erasable programmable read only memory (EEPROM) device is to use a controllable and reproducible electrical effect that has sufficient non-linearity so that the memory cell (1) can be written to (or erased) at one voltage in less than one millisecond (1 ms) and can be read at another voltage, and (2) the data within the memory cell must remain unchanged for more than ten (10) years.

Prior art stacked/split gate EEPROM technology requires (1) special multi-polysilicon materials, (2) different gate oxide thicknesses, and (3) modified doping profiles. These prior art requirements create process complexity and high cost when embedded into a complementary metal oxide semiconductor (CMOS) process.

Some of the disadvantages of earlier prior art EEPROM memory cells include low programming speed, high power consumption, high programming voltages, over-erase problems, and high processing complexity. Many of these disadvantages have been overcome by the development of new types of EEPROM Flash memory technology.

For example, research center IMEC of Leuven, Belgium has developed a proprietary EEPROM Flash memory technology under the name HIMOS®. The name HIMOS® is a registered trademark of IMEC. The name HIMOS® stands for High Injection (efficiency) Metal Oxide Semiconductor (MOS). The HIMOS® EEPROM Flash memory technology overcomes most of the drawbacks and problems associated with many of the Flash memory concepts in current use. In addition, the HIMOS® EEPROM Flash memory technology is more compatible with conventional complementary metal oxide semiconductor (CMOS) manufacturing processes.

FIG. 1 illustrates a schematic diagram of a prior art HIMOS® EEPROM Flash memory cell 100. Memory cell 100 comprises a floating gate (FG) 110 that is shown as a shaded area in FIG. 1. Memory cell 100 also comprises program gate (PG) 120 and control gate (CG) 130, source 140 and drain 150 arranged in the configuration shown in FIG. 1.

FIG. 2 illustrates a schematic diagram of a cross sectional view of the HIMOS® EEPROM Flash memory cell 100 shown in FIG. 1 taken along the line A-A'. FIG. 3 illustrates a schematic diagram of a cross sectional view of the HIMOS® EEPROM Flash memory cell 100 shown in FIG. 1 taken along the line B-B'.

The programming voltages shown in FIGS. 2 and 3 are for 0.35 µm technology. The source 140 is grounded and the drain 150 is coupled to a voltage of three and three tenths volts (3.3 V). The control gate (CG) 130 is coupled to a voltage of nine tenths of a volt (0.9 V). The program gate (PG) 120 is coupled to a voltage o:f nine volts (9 V) for supplying the necessary voltage to program the memory cell 100.

A significant problem area of the HIMOS® EEPROM Flash memory technology relates to its erase operation. Because the HIMOS® EEPROM Flash memory technology has a triple gate structure, there are three different possible modes for carrying out the erase operation. The three modes are Drain Erasure, Interpoly Erasure, and Channel Erasure. Each of the three erasure modes has its own disadvantages.

Drain Erasure mode. The standard erasure mode is drain-side erasure by Fowler-Nordheim (FN) tunneling. Fowler-Nordheim tunneling is carried out by applying a small to moderate value of voltage (3.3 V to 4.5 V) to the drain and a moderate value of negative voltage (−6.0 V to −5.0 V) to the program gate and to the control gate. By also applying the negative voltage to the control gate, the additional capacitance between the control gate and the floating gate helps to build up the necessary tunneling field, and the erase voltage is significantly reduced. Using two gates (the control gate and the floating gate) during erasure permits significant reduction in the value of required erase voltage.

The Drain Erasure mode has serious reliability concerns. The drain erasure configuration is also the same configuration for generating hot holes. This configuration (1) causes Oxide damage and degrades cycling performance, and (2) over-erases as a result of the injection of extra holes into the floating gate in addition to the electrons that tunnel out of the floating gate.

Interpoly Erasure mode. Erasure can also be accomplished by interpoly conduction, which is established by applying a moderate positive voltage to the control gate, eventually combined with a moderate negative voltage to the program gate. In CMOS processes the interpoly oxide integrity is not as good as the integrity of thermally grown oxide. Interpoly Erasure causes memory window early closure and erase time push out. The leakage current is also high and leads to high temperature retention degradation. Except for split gate flash memory, no other mainstream flash technology uses an interpoly erasure scheme. In split gate flash technology, a special injector has to be created to carry out the Interpoly Erasure process. The creation of the structure of the special injector for the memory cell requires complicated and expensive processes.

Channel Erasure mode. In the Channel Erasure mode a positive voltage is applied to the P-well of the memory array in order to avoid the band-to-band tunneling (and the correlated hot hole injection) that occurs in the drain-side erase mode. The Channel Erasure mode permits low-power erasure at the expense of adding one more processing step in the manufacturing process (i.e., the addition of an N-well for memory array isolation).

Of the three erasure modes for the HIMOS® flash memory cell, the Channel Erasure mode has the best reliability performance. However, its superior reliability performance comes with the drawback of requiring an additional N-well for memory array isolation. The additional N-well requires an additional mask step and therefore adds additional cost to the manufacture of the HIMOS® flash memory cell.

Therefore, there is a need in the art for a system and method that is capable of solving the performance problems described above that are exhibited by the HIMOS® EEPROM Flash memory technology. In particular, there is a need in the art for a system and method for providing an improved EEPROM flash memory cell having an increased level of reliability for the erase process without having to provide an additional N-well in the memory cell.

The present invention provides a new EEPROM memory cell structure that comprises an erase capacitor connected to the program gate (PG) and the control gate (CG) of a HIMOS® EEPROM Flash memory cell. The erase capacitor of the present invention is implemented by tying together the source and drain and N-well of a P-type metal oxide semiconductor (PMOS) transistor in a standard CMOS manufacturing process. The gate of the PMOS transistor is connected to the floating gate (FG) of the memory cell and becomes part of the floating gate. A positive voltage bias is applied to the erase capacitor to carry out a channel erasure process in the EEPROM memory cell.

The EEPROM memory cell of the present invention provides an increased level of reliability for the erase process without requiring an additional process step to be added in the manufacture of the EEPROM memory cell. Furthermore, by optimizing the capacitive coupling between the PMOS transistor and the EEPROM memory cell, the erase voltage can be significantly decreased. This reduces the size of the peripheral circuitry that is used to generate the high voltage and, consequently, improves the efficiency of the memory cell array.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 4 through 10, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged electrically erasable programmable read only memory (EEPROM) device.

Figure 1:
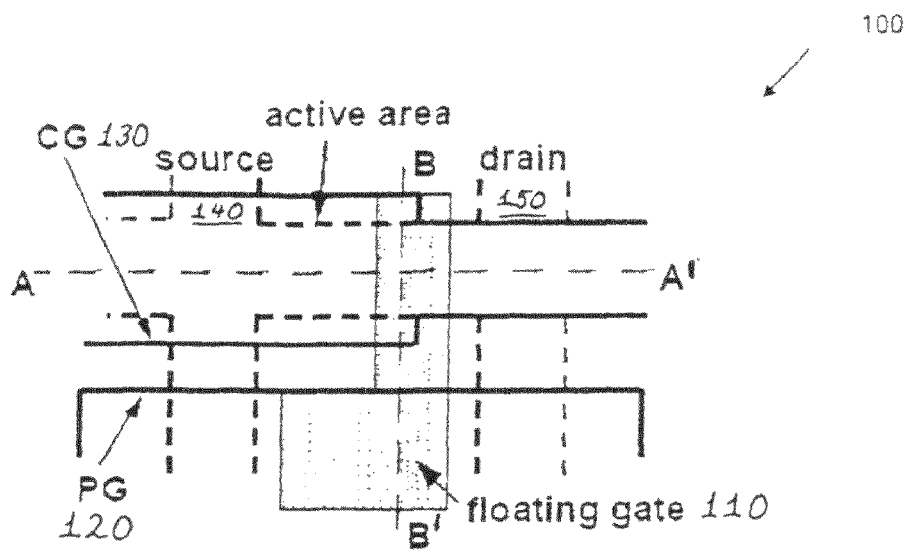
FIG. 1 illustrates a schematic diagram of a prior art memory cell of HIMOS® EEPROM Flash memory technology.
Figure 2:
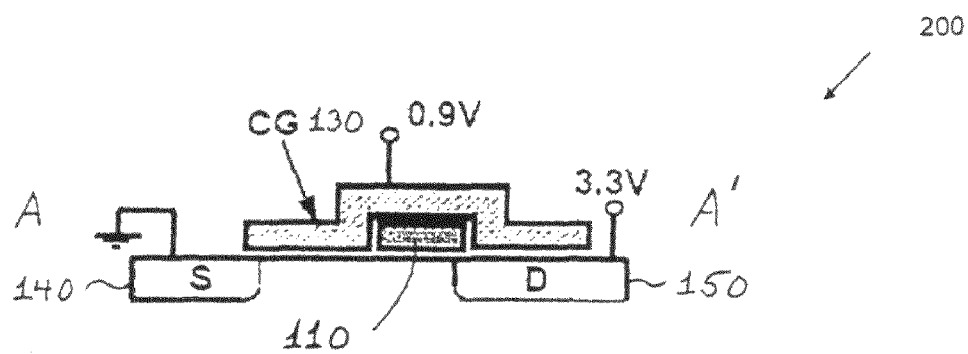
FIG. 2 illustrates a schematic diagram of a cross sectional view of the prior art memory cell shown in FIG. 1 taken along the line A-A'.
Figure 3:
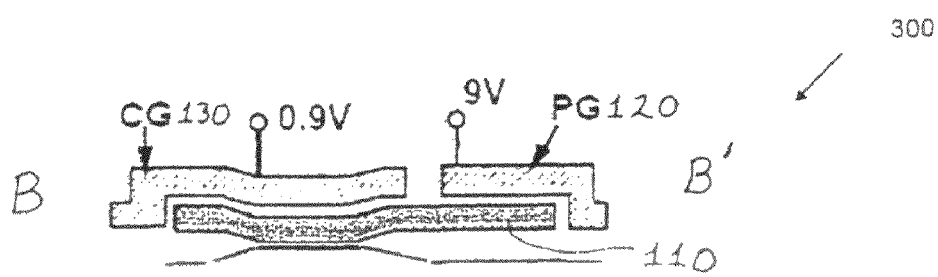
FIG. 3 illustrates a schematic diagram of a cross sectional view of the prior art memory cell shown in FIG. 1 taken along the line B-B'.
Figure 4:
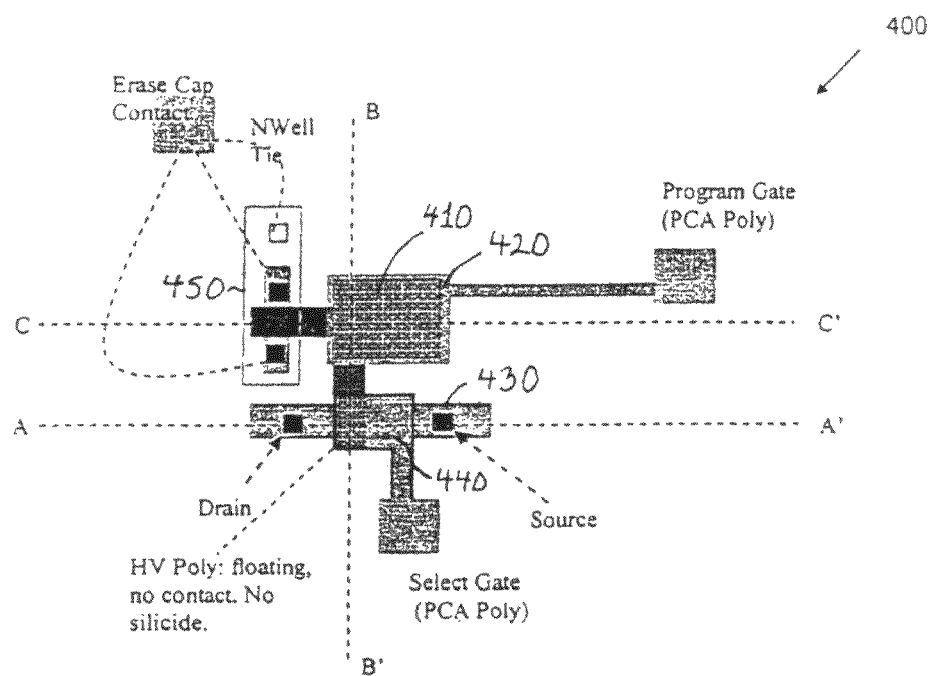
FIG. 4 illustrates a schematic diagram of a plan view of an advantageous embodiment of an EEPROM memory cell of the present invention.

FIG. 4 illustrates a schematic diagram of a plan view of an advantageous embodiment of an EEPROM memory cell 400 of present invention. Memory cell 400 comprises comprises a floating gate (FG) 410, a program gate (PG) 420, a control gate (CG) 430, a select gate (SG) 440, and an erase capacitor (EC) 450 connected together in the configuration shown in FIG. 1.

The floating gate (FG) 410 is made of a high voltage polysilicon (HV Poly) material. The program gate (PG) 420, the control gate (CG) 430, and the select gate (SG) 440 are each made of a PCA polysilicon (PCA Poly) material. The letters PCA stand for "polysilicon capacitor." The erase capacitor (EC) 450 is formed by tying together the source, drain and N-Well of a PMOS transistor. As will be more fully described, the gate of the PMOS transistor is connected to the floating gate (FG) 410 of the memory cell 400 to couple a low voltage bias to the floating gate (FG) 410 of the memory cell 400.

As previously described, the HIMOS® EEPROM Flash memory technology can avoid the band-to-band tunneling (and the correlated hot hole injection) that exists in the Drain Erasure mode by using the Channel Erasure mode. However, the Channel Erasure mode requires an additional process step during the manufacturing process in order to implant an N-well for memory array isolation. Otherwise, all of the devices and circuitry on the integrated circuit wafer would experience a large erase voltage of as much as eighteen volts (18 V). This amount of voltage would be intolerable for most of the devices and circuitry on the integrated circuit wafer. The present invention solves this problem by providing the erase capacitor (EC) 450 in the memory cell 400.

In a CMOS manufacturing process, all N-type metal oxide semiconductor (NMOS) devices are in a connected P-Well and the P-type metal oxide semiconductor (PMOS) devices are in an isolated N-Well. Positive voltage bias applied on an N-Well is isolated from other parts of the integrated circuit wafer due to the reversed p-n junction. The gate of the PMOS transistor of erase capacitor (EC) 450 is connected to the floating gate 410 of memory cell 400 and the source, drain and N-Well of the PMOS transistor are tied together. This places a low voltage bias on the floating gate 410 of memory cell 400. As a result, the electric field across the gate oxide of the PMOS transistor of the erase capacitor (EC) 450 is high and allows channel erasure by Fowler-Nordheim (FN) tunneling.

By changing the gate capacitor ratio between the PMOS transistor of the erase capacitor (EC) 450 and the floating gate 410 of the memory cell 400, it is possible to control how much voltage is coupled to the floating gate (FG) 410 and thereafter lower the amount of voltage that is required to carry out the channel erase process. The high voltage in the memory cell array is generated by charge pumping circuitry. The larger the voltage is that is required to carry out the channel erase process, the larger the size must be of the charge pumping circuitry. The memory array efficiency is the ratio of the area of all of the memory cells in the memory cell array to the area of the peripheral supporting circuitry (e.g., the charge pumping circuitry). The memory array efficiency of a memory array is improved with lower values of erase voltage.

Figure 5:
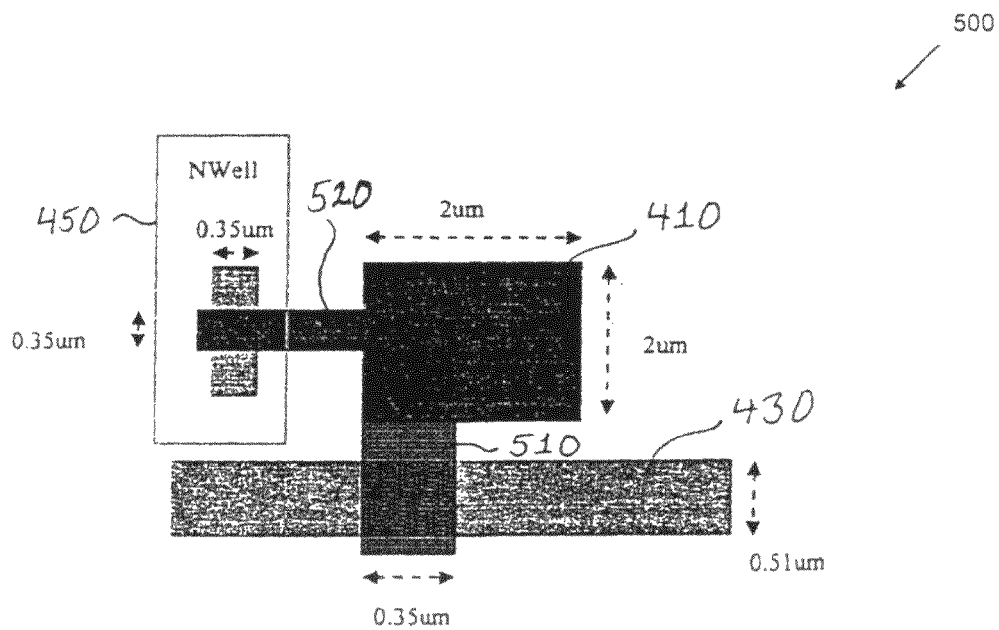
FIG. 5 illustrates a schematic diagram of a plan view showing the dimensions of an advantageous embodiment of a high voltage (HV) polysilicon floating gate (FG) of an EEPROM memory cell of the present invention.

FIG. 5 illustrates a schematic diagram of a plan view 500 showing the dimensions of an advantageous embodiment of a high voltage (HV) polysilicon floating gate (FG) 410 of an EEPROM memory cell of the present invention. The floating gate (FG) 410 comprises a square portion that is approximately two microns (2 μm) on each side. The floating gate (FG) 410 also comprises a first rectangular portion 510 that is approximately thirty five hundredths of a micron (0.35 μm) wide that extends transversely over the control gate (CG) 430 as shown in FIG. 5. The control gate (CG) 430 is approximately fifty one hundredths of a micron (0.51 μm) wide.

The floating gate (FG) 410 also comprises a second rectangular portion 520 that is approximately thirty five hundredths of a micron (0.35 μm) wide that extends transversely over the erase capacitor (EC) 450 as shown in FIG. 5. The dimensions of the PMOS transistor of the erase capacitor (EC) 450 are not drawn to scale in FIG. 5. The PMOS transistor of the erase capacitor (EC) 450 is also approximately thirty five hundredths of a micron (0.35 μm) wide.

Figure 6:
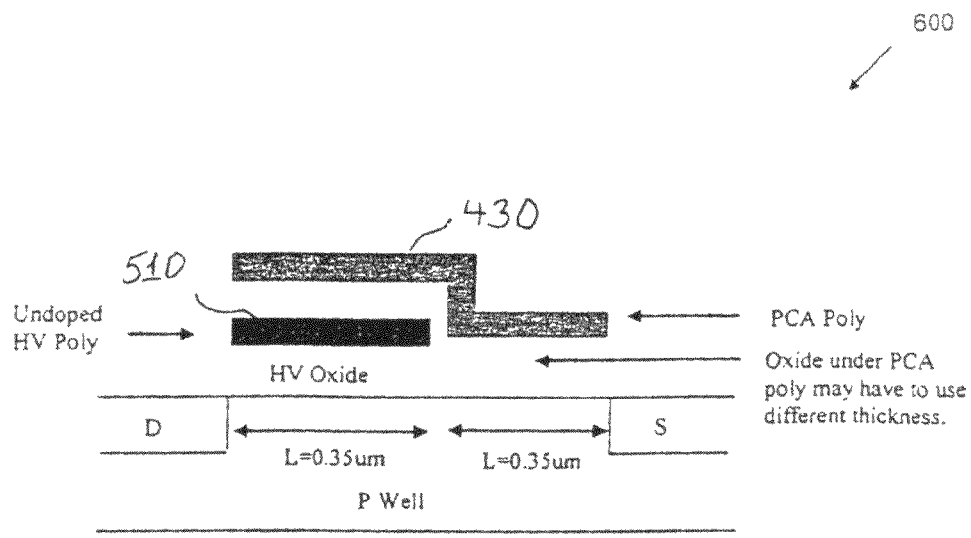
FIG. 6 illustrates a schematic diagram of a cross sectional view of the EEPROM memory cell of the present invention shown in FIG. 4 taken along the line A-A'.

FIG. 6 illustrates a schematic diagram of a cross sectional view 600 of the EEPROM memory cell 400 of the present invention shown in FIG. 4 taken along the line A-A'. The first rectangular portion 510 of the floating gate 410 is shown over a layer of high voltage oxide (HV Oxide). The select gate 440 is also shown having a portion that extends over the rectangular portion 510 of the floating gate 410.

Figure 7:
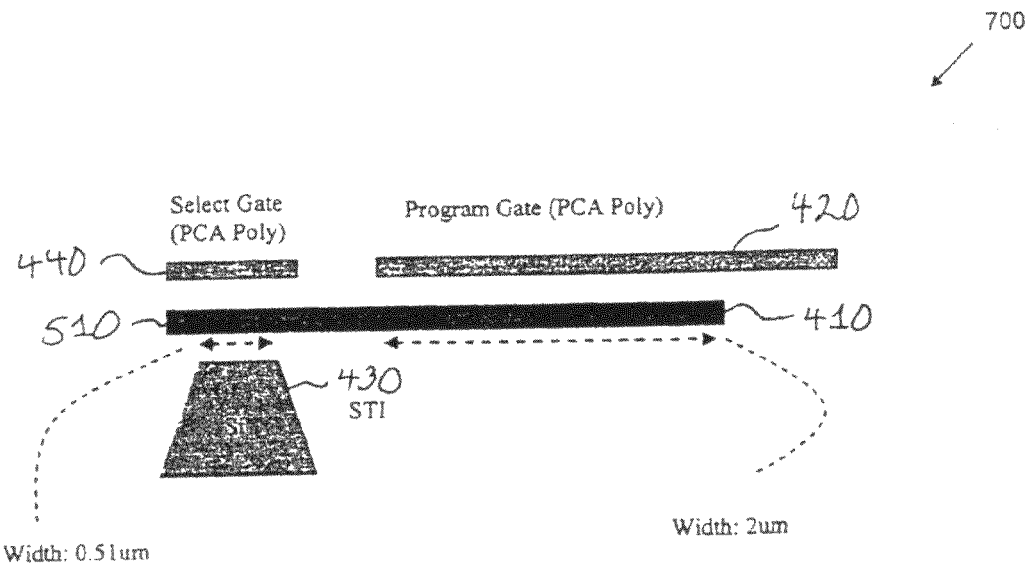
FIG. 7 illustrates a schematic diagram of a cross sectional view of the EEPROM memory cell of the present invention shown in FIG. 4 taken along the line B-B'.

FIG. 7 illustrates a schematic diagram of a cross sectional view 700 of the EEPROM memory cell 400 of the present invention shown in FIG. 4 taken along the line B-B'. The first rectangular portion 510 of the floating gate (FG) 410 extends over the control gate (CG) 430. A portion of the select gate (SG) 440 is located over the first rectangular portion 510 of the floating gate (FG) 410. The portion of the floating gate (FG) 410 that is shown in FIG. 7 as having a width of two microns (2 μm) represents the square portion of the floating gate (FG) 410. The program gate (PG) 420 is located over the square portion of the floating gate (FG) 410.

Figure 8:
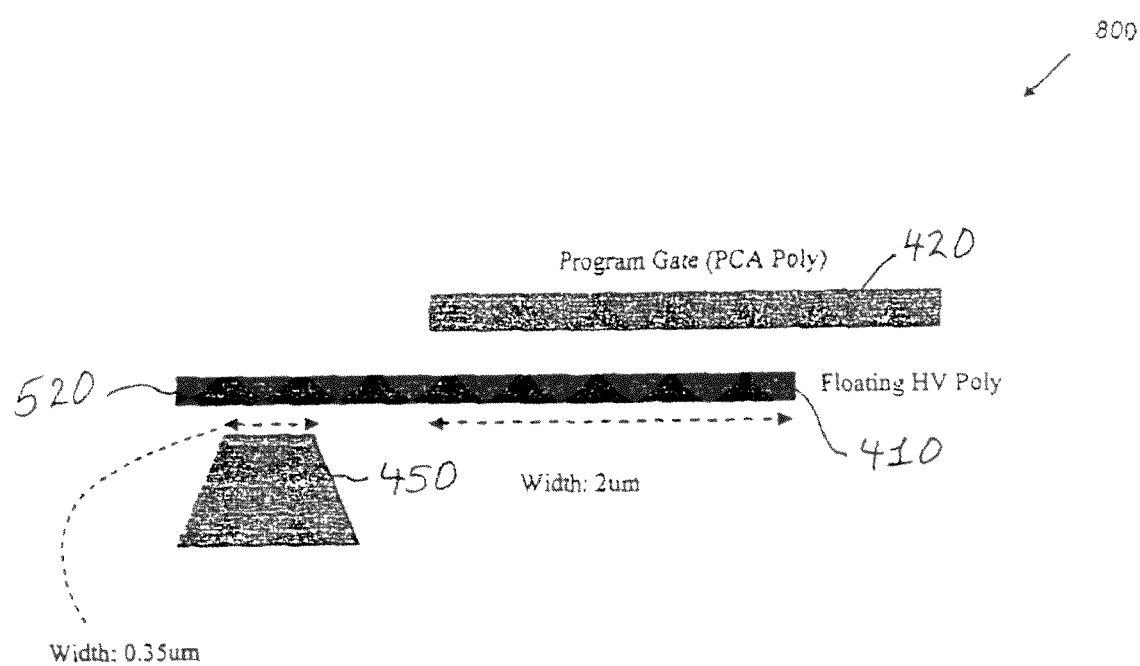
FIG. 8 illustrates a schematic diagram of a cross sectional view of the EEPROM memory cell of the present invention shown in FIG. 4 taken along the line C-C'.

FIG. 8 illustrates a schematic diagram of a cross sectional view of the EEPROM memory cell of the present invention shown in FIG. 4 taken along the line C-C'. The second rectangular portion 520 of the floating gate (FG) 410 extends over the PMOS transistor of the erase capacitor (EC) 450. The portion of the floating gate (FG) 410 that is shown in FIG. 8 as having a width of two microns (2 μm) represents the square portion of the floating gate (FG) 410. The program gate (PG) 420 is located over the square portion of the floating gate (FG) 410.

Figure 9:
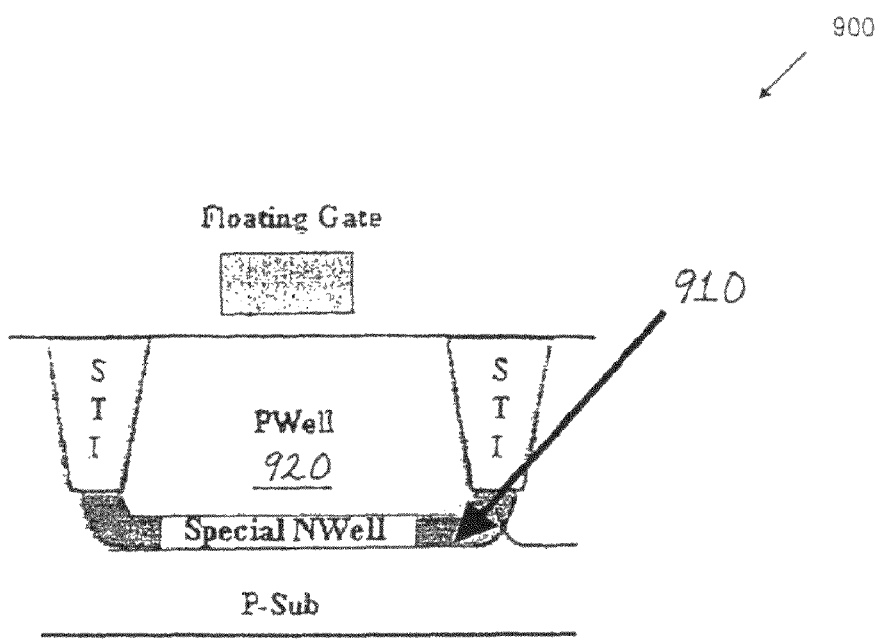
FIG. 9 illustrates a schematic diagram of a cross sectional view of a prior art EEPROM memory cell showing a location of a special N-well required to isolate a P-well.

FIG. 9 illustrates a schematic diagram 900 of a cross sectional view of a prior art EEPROM memory cell showing a location of a special N-Well 910 required to isolate a P-well for memory array isolation. A special implant step in the prior art is needed in order to create a deeper and larger N-Well 910 than the P-Well 920 where the memory array is located to isolate the P-Well 920 with the reverse p-n junction. Formation of the special N-Well 910 is not a standard CMOS process.

Figure 10:
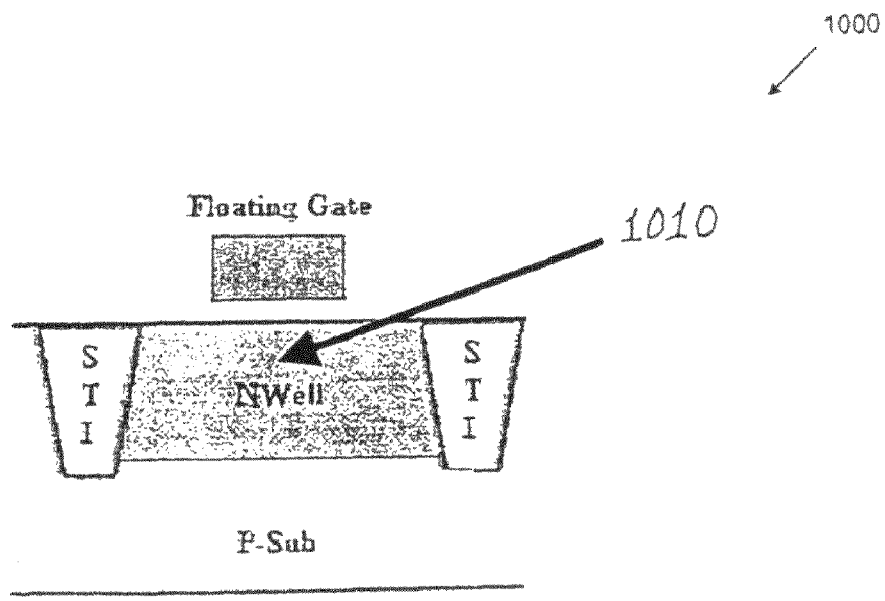
FIG. 10 illustrates a schematic diagram of a cross sectional view of an advantageous embodiment of an EEPROM memory cell of the present invention showing an N-well located at the position of a P-well of the memory cell of the present invention.

FIG. 10 illustrates a schematic diagram 1000 of a cross sectional view of an advantageous embodiment of an EEPROM memory cell 400 of the present invention showing an N-well 1010 located at the same level as a P-well of the memory cell 400 of the present invention. Formation of the N-Well 1010 is a standard CMOS process. Formation of the N-Well 1010 does not require a special additional manufacturing step and does not require additional manufacturing cost.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method comprising the steps of:
   forming an electrically erasable programmable read only memory cell that comprises a program gate, a control gate, a select gate, and a floating gate; and
   coupling an erase capacitor to the floating gate, the erase capacitor configured to couple a voltage bias to the floating gate during a channel erase procedure in which data in the memory cell is erased;
   wherein the floating gate includes a square portion, a first rectangular portion coupled to the square portion and extending transversely over the control gate, and a second rectangular portion coupled to the square portion and extending transversely over the erase capacitor, a long dimension of the first rectangular portion substantially perpendicular to a long dimension of the second rectangular portion; and
   wherein at least a portion of the select gate extends over the first rectangular portion of the floating gate and is at approximately a same level as the program gate.

2. The method as set forth in claim 1, further comprising the step of:
   selecting a gate capacitor ratio between the erase capacitor and the floating gate of the memory cell to control a voltage that is required to carry out the channel erase procedure.

3. The method as set forth in claim 2, further comprising the step of:
   selecting the gate capacitor ratio between the erase capacitor and the floating gate to enable a desired level of performance of a Fowler-Nordheim erase process in the memory cell.

4. The method as set forth in claim 1, wherein coupling the erase capacitor to the floating gate of the memory cell comprises:

creating the erase capacitor in the memory cell without an additional process step for the erase capacitor being added to a manufacturing process for the memory cell.

5. The method as set forth in claim 4, wherein the erase capacitor comprises a P-type metal oxide semiconductor transistor having a source, a drain, and an N-well tied together, the erase capacitor also having a gate coupled to the floating gate of the memory cell.

6. The method as set forth in claim 5, wherein the N-well is located at a same level in the memory cell as a P-well of the memory cell.

7. The method of claim 1, further comprising:
coupling the erase capacitor to the program gate.

8. The method of claim 1, further comprising:
forming the erase capacitor by tying together a source, a drain, and an N-well of a P-type metal oxide semiconductor.

9. A method comprising:
providing an electrically erasable programmable read only memory cell that comprises a program gate, a control gate, a select gate, and a floating gate; and
coupling an erase capacitor to the floating gate, the erase capacitor configured to couple a voltage bias to the floating gate during a channel erase procedure in which data in the memory cell is erased;
wherein the floating gate includes a square portion, a first rectangular portion coupled to the square portion and extending transversely over the control gate, and a second rectangular portion coupled to the square portion and extending transversely over the erase capacitor, a long dimension of the first rectangular portion substantially perpendicular to a long dimension of the second rectangular portion, at least a portion of the select gate extending over the first rectangular portion of the floating gate and at approximately a same level as the program gate.

10. The method of claim 9, further comprising:
coupling the erase capacitor to the program gate.

11. The method of claim 9, further comprising:
forming the erase capacitor by tying together a source, a drain, and an N-well of a P-type metal oxide semiconductor.

12. The method of claim 9, further comprising:
creating the erase capacitor without an additional process step for the erase capacitor being added to a manufacturing process for the memory cell.

13. The method of claim 9, wherein:
the erase capacitor comprises a P-type metal oxide semiconductor transistor having a source, a drain, and an N-well tied together, the erase capacitor also having a gate coupled to the floating gate of the memory cell; and
the N-well is located at a same level in the memory cell as a P-well of the memory cell.

14. A method comprising:
in an electrically erasable programmable read only memory cell, providing a voltage bias from an erase capacitor to a floating gate during a channel erase procedure, the memory cell comprising a program gate, a control gate, a select gate, the floating gate, and the erase capacitor;
wherein the floating gate includes a square portion, a first rectangular portion coupled to the square portion and extending transversely over the control gate, and a second rectangular portion coupled to the square portion and extending transversely over the erase capacitor, a long dimension of the first rectangular portion substantially perpendicular to a long dimension of the second rectangular portion; and
wherein at least a portion of the select gate extends over the first rectangular portion of the floating gate and is at approximately a same level as the program gate.

15. The method of claim 14, wherein the voltage is a low positive voltage.

16. The method of claim 14, further comprising:
controlling an amount of voltage that is required to carry out the channel erase procedure by selecting a gate capacitor ratio between the erase capacitor and the floating gate of the memory cell.

17. The method of claim 16, further comprising:
selecting the gate capacitor ratio between the erase capacitor and the floating gate to enable a desired level of performance of a Fowler-Nordheim erase process in the memory cell.

18. The method of claim 14, wherein the erase capacitor comprises a P-type metal oxide semiconductor transistor having a source, a drain, and an N-well tied together and having a gate coupled to the floating gate of the memory cell.

19. The method of claim 14, wherein the erase capacitor is coupled to the program gate.

20. The method of claim 14, wherein:
the erase capacitor comprises a P-type metal oxide semiconductor transistor having a source, a drain, and an N-well tied together, the erase capacitor also having a gate coupled to the floating gate of the memory cell; and
the N-well is located at a same level in the memory cell as a P-well of the memory cell.

* * * * *